(12) United States Patent
Railkar et al.

(10) Patent No.: US 8,925,262 B2
(45) Date of Patent: Jan. 6, 2015

(54) MULTI-PURPOSE RIDGE VENT SYSTEM

(71) Applicant: Building Materials Investment Corporation, Dallas, TX (US)

(72) Inventors: Sudhir Railkar, Wayne, NJ (US); Walter Zarate, Wayne, NJ (US); Matti Kiik, Richardson, TX (US)

(73) Assignee: Building Materials Investment Corporation, Dallas, TX (US)

( * ) Notice: Subject to any disclaimer, the term of this patent is extended or adjusted under 35 U.S.C. 154(b) by 0 days.

(21) Appl. No.: 13/799,677

(22) Filed: Mar. 13, 2013

(65) Prior Publication Data

US 2014/0259998 A1    Sep. 18, 2014

(51) Int. Cl.
| | | |
|---|---|---|
| *E04D 5/00* | (2006.01) | |
| *F24F 7/02* | (2006.01) | |
| *E04D 3/00* | (2006.01) | |
| *H01L 31/048* | (2014.01) | |
| *E04D 13/10* | (2006.01) | |

(52) U.S. Cl.
CPC .......... *H01L 31/0482* (2013.01); *E04D 13/103* (2013.01)
USPC ................ 52/173.3; 52/199; 52/198; 52/202; 454/365

(58) Field of Classification Search
CPC ... E04D 13/174; E04D 13/178; E04D 13/152; E04D 13/1631; E04D 13/1612; E04D 13/1618; E04D 13/17; E04D 1/30; E04D 12/002; E04D 13/00; E04D 13/476; E04D 1/20; E04D 1/36; E04D 13/1475; E04D 3/06; E04D 3/40; E04B 1/74
USPC ........... 52/173.1, 198, 90.1–90.2, 91.1–91.3, 52/173.3, 302.1; 454/365
See application file for complete search history.

(56) References Cited

U.S. PATENT DOCUMENTS

| | | | | |
|---|---|---|---|---|
| 3,325,951 | A | * | 6/1967 | Johnson ............................ 52/86 |
| 4,139,399 | A | * | 2/1979 | Lindmayer ................... 136/251 |
| 4,571,897 | A | * | 2/1986 | Kerr ................................... 52/13 |
| 4,643,080 | A | * | 2/1987 | Trostle et al. ................. 454/365 |
| 5,803,806 | A | * | 9/1998 | Blessinger .................... 454/365 |
| 6,283,852 | B1 | * | 9/2001 | Igo ................................ 454/365 |
| 7,219,473 | B2 | * | 5/2007 | Mantyla et al. ................. 52/198 |
| 2013/0074428 | A1 | * | 3/2013 | Allen et al. .................. 52/173.3 |

FOREIGN PATENT DOCUMENTS

JP            09060227 A   *   3/1997

* cited by examiner

*Primary Examiner* — Jeanette E Chapman
(74) *Attorney, Agent, or Firm* — Womble Carlyle Sandridge & Rice, LLP

(57) ABSTRACT

A solar ridge vent includes an elongated laterally flexible panel having edge portions and ventilation grids extending along the edge portions. Channel members extend along the edge portions of the panel and define channels that have channel openings facing inwardly. The channels are sized to receive edges of auxiliary components to hold the auxiliary components on the ridge vent. The auxiliary components may be ridge cap shingles, slate cap shingles, light emitting emergency location panels, or fluid heating panels. In a preferred embodiment, solar power generating panels are configured to be mounted on the ridge vent with its edges held in the channels. A remote electrical box has chargeable batteries, a power inverter, and an AC outlet to provide electrical power in an emergency.

5 Claims, 6 Drawing Sheets

MULTI-PURPOSE RIDGE VENT SYSTEM

TECHNICAL FIELD

This disclosure relates generally to ridge vents and more particularly to ridge vents that can incorporate solar panels for generating electricity and other components.

BACKGROUND

Ridge vents for ventilating attic spaces are well known. One type of ridge vent is formed from elongated injection molded ridge vent sections having a flexible central panel with ventilation grids and usually wind baffles formed along the edges of the panel. The ridge vent sections are installed end-to-end along and covering a ridge slot cut in the ridge of a roof and are attached with nails driven through nail bosses of the ridge vent sections into a roof deck below. Warm attic air passes by convection through the ridge slot, beneath the central panel, and exits to the environment through the ventilation grids. Traditionally, ridge vents are covered with ridge cap shingles after they are installed for aesthetic blending with the surrounding shingles of a roof.

Solar panels on roofs also are becoming more popular as their cost decreases and their efficiency increases. Typically, solar panels on homes are electrically connected to the public power grid and supplement the grid with electrical power that they generate. Electric power companies pay consumers for this supplemental power so that electric bills can be reduced or eliminated. Traditional home solar power systems work well under normal circumstances. However, in an emergency when the public power grid is off for extended periods, the electrical power generated by a homeowner's solar panels is not available for use by the homeowner. This was experienced, for example, during hurricane Sandy in the Northeast, when homeowners with solar power systems nevertheless had no accessible electricity to charge cell phones, operate televisions, and otherwise provide emergency power.

Traditional ridge vents have long performed the single function of ventilating an attic space below a roof. However, the exposed surface area of a ridge vent can be significant and historically has not been exploited. A need exists for a ridge vent designed to exploit its exposed surface area in such a way that the ridge vent can perform additional functions such as, for instance, generation of electrical power. A further need exists for a rooftop solar power system that provides emergency electrical power when the public grid is offline for extended periods or during emergencies. It is to the provision a ridge vent and system that the present invention is primarily directed.

SUMMARY

Briefly described, a ridge vent system comprises a ridge vent having an elongated laterally flexible panel with a central portion and longitudinally extending first and second edge portions. The elongated panel has a first surface that faces away from a roof when the ridge vent is installed and a second surface that faces in the opposite direction. A ventilation grid is disposed along each of the edge portions of the central panel to allow attic air to escape to the atmosphere when the ridge vent is installed along the ridge of a roof covering a ridge slot. A first channel is defined on the first surface of the panel and extends along the first edge portion thereof. The first channel has a channel opening that faces the central portion of the flexible panel. A second channel is defined on the first surface of the panel extending along the second edge portion thereof. The second channel has a channel opening also facing the central portion of the flexible panel.

The first and second channels are sized to receive and hold auxiliary components to be attached to the ridge vent. These auxiliary components may, for example, be ridge cap shingles with edges disposed in the channels to hold the shingles in place or slate cap shingles similarly held in place in the channels. The auxiliary components also may be a light emitting panel that can be lighted in an emergency to help first responders locate the distressed home or a fluid heating panel having fluid conduits through which a fluid can be pumped to be heated by the sun. Additional auxiliary components may include a light gathering panel with arrays of Fresnel-like lenses that capture sunlight, which can then be directed through fiber optic cables to provide natural interior light. An auxiliary component also may be a panel with heating elements powered by solar power that function to melt snow from the roof ridge in cold climates.

In the most preferred embodiment, however, the auxiliary component is one or more solar power generating panels that generate electrical power when exposed to sunlight. These solar panels are electrically connected to a power inverter that converts the DC power of the solar panels to usable AC power and an AC outlet is located for access by a homeowner to power small electrical appliances in an emergency. A battery bank may be included and has batteries that are charged when the solar panel is generating power so that access to power is available at night or when the solar panel is otherwise not actively generating power.

It will thus be seen that a ridge vent is now provided that can be used to generate usable electrical power even when the public electric grid is off line. This power can be used to charge cell phones, operate small appliances such as televisions, or otherwise help sustain homeowners in emergency situations. These and other features, aspects, and advantages will be appreciated upon review of the detailed description set forth below when taken in conjunction with the accompanying drawing figures, which are briefly described as follows.

DETAILED DESCRIPTION

Figure 1:
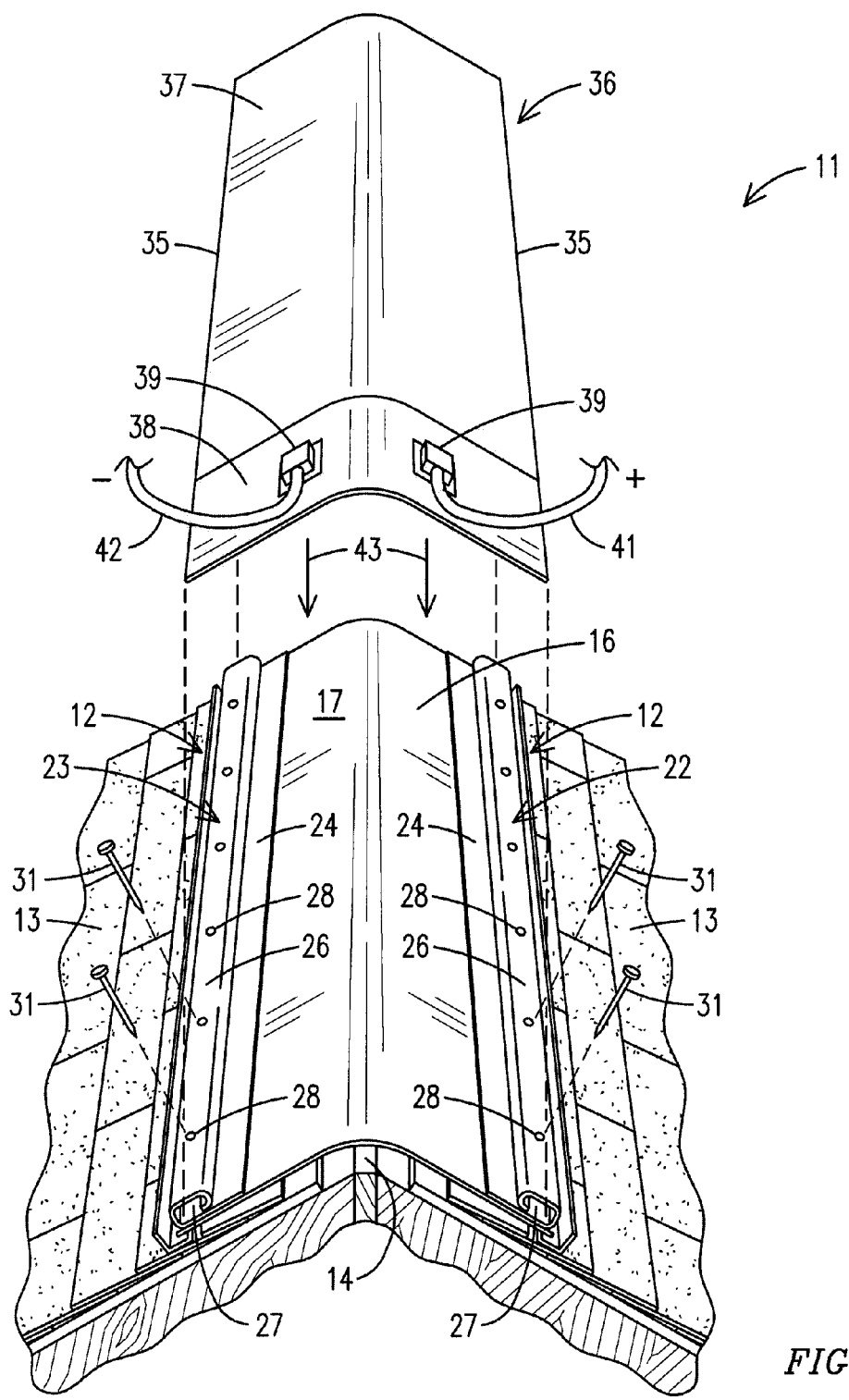
FIG. 1 is a perspective exploded view of a ridge vent that embodies principles of the invention showing an auxiliary component in the form of a solar panel attachable thereto.

Reference will now be made in more detail to the drawing figures, wherein like parts are identified with like reference numbers throughout the several views. The following detailed description will be presented primarily in the context of a ridge vent that carries solar panels for generating electrical power when exposed to sunlight. However, this should not be construed as a limitation of the invention, which may be usable for mounting a variety of other auxiliary components to the ridge vent.

Figure 3:
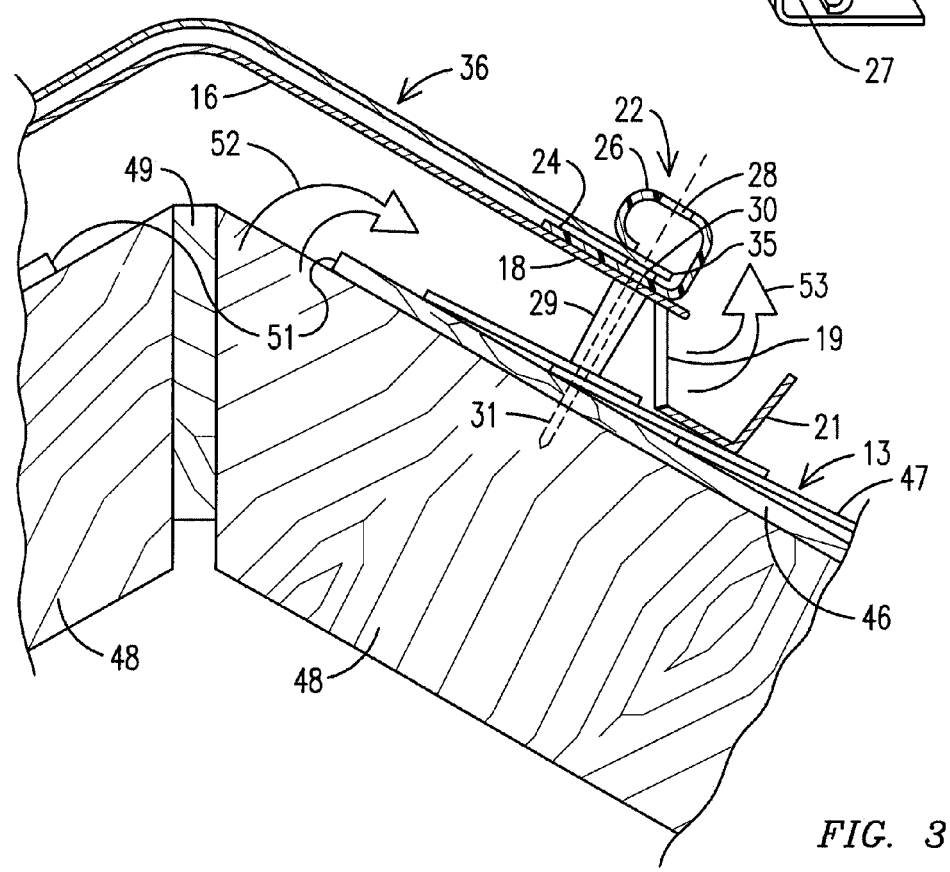
FIG. 3 is a partially cross sectioned view of a ridge vent with solar panel attached according to principles of the invention.

Referring more particularly to FIG. 1, a ridge vent system 11 comprises a ridge vent 12 attached to a shingled roof 13 extending along a ridge 14 of the roof. A ridge slot 51 (FIG. 3) is formed along the ridge 14 and is covered by the ridge vent 12 as is known in the art. The ridge vent 12, which may be made of injection molded plastic, has an elongated laterally flexible panel 16 with a central portion and edge portions. A surface 17 of the ridge vent faces upwardly away from the roof 13. As best shown in FIG. 3, ventilation grids 19 extend along and beneath the edge portions 18 of the panel 16 and, in the illustrated embodiment, which is not limiting, wind baffles 21 extend along and outboard of the ventilation grids 19. FIG. 3 shows only one edge portion of the ridge vent, but it will be understood that the opposite edge portion is a mirror image of the edge portion shown in FIG. 3.

Referring again to FIG. 1, a first channel member 22 extends along one of the edge portions of the panel 16 and a second channel member 23 extends along the opposite edge portion. Each channel portion includes a base 24 that rests against the panel 16 and a hood 26 that extends over the base 24 to form an elongated channel 27 extending along each edge portion of the ridge vent. Each channel 27 has a channel slot that faces inwardly toward the center of the panel and that provides access to the channel. Preferably, the channel members are made of extruded plastic or other resilient material so that the channel slots are widened upon insertion of the edge of an auxiliary component into the channels through the channel slots. In this way, the upper edges of the channel slots can bear on the edges of an auxiliary component to help hold it in place.

A series of openings or holes 28 are formed through the hood 26 of each channel member at predetermined spaced intervals. The holes 28 are spaced so that they align with the nail bosses 29 (FIG. 3) of the ridge vent below. In this way, the channel members may be installed concurrently with installation of the ridge vent itself by inserting nails 31 through the holes 28, through the bases 24 of the channel members, through the nail bosses 29 in the ridge vent below, and into the underlying roof deck. Thus, the nails function to hold the ridge vent fast to the roof deck and also function to hold the channel members firmly to the ridge vent. Preferably, the holes 28 are sized and configured to accommodate the tip of a nail gun so that the nails may be expeditiously driven with pneumatic assistance.

A flexible solar panel 36 is shown in FIG. 1 above the installed ridge vent 22. The solar panel 36 has an active surface 37 that generates electrical power when exposed to sunlight and an endlap portion 38 that is not electrically active but bears junction boxes 39 from which a positive electrical wire 41 and a negative electrical wire 42 respectively extend. The endlap portion 38 is designed to be covered by the end of the active portion of another solar panel when two or more solar panels are installed end-to-end to increase the power produced by a solar panel installation. The wires of such panels can be connected in series or parallel as desired. As indicated by arrows 43 in FIG. 1, the solar panel 36 can be mounted on the ridge vent 22 by lowering it in place on the ridge vent. The solar panel 36 can then be flexed or bent until its edges slide through the channel slots of the channels 27, whereupon the solar panel flattens slightly to urge its edges completely into the channels 27. The solar panel 36 is thus mounted on the ridge vent, where it is held firmly in place by the channel members 26.

Once so mounted on the ridge vent 22, the wires 41 and 42 of the solar panel 36 can be routed laterally as shown and through the channels 27 so that they are hidden from view and exposure. Electrical connections between multiple end-to-end solar panels may be obtained at the junction boxes 39 and the wires of the last in a series and/or intermediate ones of end-to-end solar panels can be routed to a remote location to deliver electrical power generated by the solar panels. It is thus seen that a solar panel of arbitrary length may be obtained on the ridge vent by attaching a number of independent solar panels together end-to-end and mounting them to the ridge vent as described. One suitable flexible solar panel for use in the present invention is available from PowerFilm® Inc. of Aims, Iowa although other suppliers of such panels are also available. Further, the invention is not limited to flexible solar panels, which tend to be less efficient than traditional more rigid crystalline solar panels. Crystalline solar panels may be substituted by, for instance, forming a hinged junction between two narrow crystalline solar panels and installing them essentially as described above. A sharper peak will be formed along the ridge of a roof, but this generally is not considered objectionable, and the crystalline solar panels are more efficient at producing electrical power from sunlight.

Figure 2:
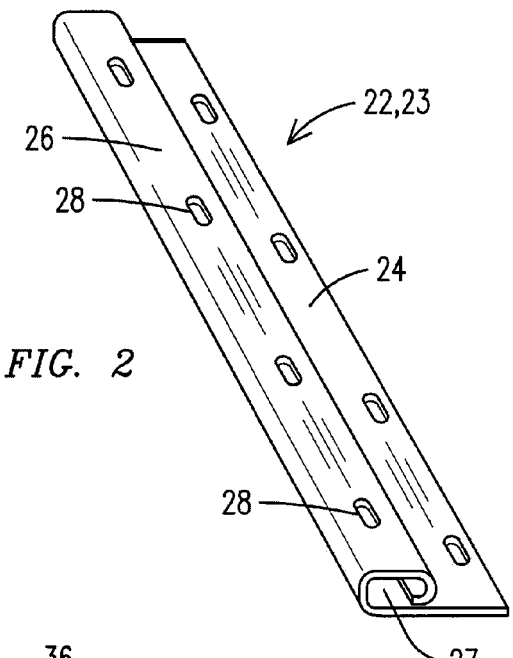
FIG. 2 is a perspective view of one embodiment of a channel member according to the invention.

FIG. 2 shows one possible configuration of a channel member 22, 23 usable in the present invention. The channel member 22, 23 includes a base 24 sized to fit flush on the upper surface of a ridge vent. The channel member 22, 23 is bent up along its outer edge and then over the base 24 to form a hood that, along with the base, defines a channel 27 that extends along the channel member. The inside edge of the hood 26 may be bent down as shown to form with the base a channel slot opening into the channel 27. Spaced nail holes 28 are punched or otherwise formed in the hood 26 to accommodate nails as described above. The channel members may be formed of plastic that is resistant to UV radiation and the elements and preferably is formed by extrusion through a die. However, other materials such as aluminum or steel may be substituted and may be fabricated with other processes such as roll forming. Neither the material nor the shape of the channel members 22, 23 shown in the exemplary embodiments should be construed to be limiting of the invention that they embody.

FIG. 3 is a partially cross sectioned end view of a multipurpose ridge vent of this invention installed on the ridge of a roof. The roof is formed of roof rafters 48 that may or may not meet at a ridge beam 49 at the ridge of the roof. The rafters 48 support a roof deck 46 that, in turn, supports shingles 47 in the traditional manner. A ridge slot 51 is formed along the ridge of the roof and opens to the attic space below the roof. A ridge vent system according to one embodiment of the invention is installed along the roof ridge. As described above, the ridge vent system includes a ridge vent having a laterally flexible panel 16 with edge portions 18, ventilation grids 19, and a wind baffle 21. An array of nail bosses 29 project downwardly from the panel 16 to rest on the roof and the nail bosses have internal passageways through which nails 31 are inserted and driven into the roof deck below to secure the ridge vent to the roof. The ridge vent also may have additional depending supports and/or rain baffles that are omitted from FIG. 3 for clarity.

A channel member 22 is mounted to and extends along the edge portion 18 of the panel 16 as described. As discussed, the channel member 22 has a base 24 and a hood 26 that overlies the base to define a channel extending along the channel member. As shown, the inner edge of the hood 26 is bent down and in to define a channel slot opening into the channel of the channel member. FIG. 3 shows clearly how the heads 30 of the nails 31 bear against the base 24 of the channel member 22 to fix and hold the channel member securely to the panel 16. The flexible solar panel 26 is shown clearly in FIG. 3 with its edges 35 extending through the channel slot and disposed within the channel 27 of the channel member 22. Preferably, but not necessarily, the channel member is made of a somewhat resilient material so that the upper edge of the channel slot bears on the flexible solar panel 36 to help hold it in place. The ventilation function of the ridge vent is not impaired as air flows freely out of the attic as indicated at 52 and vents to the atmosphere as indicated at 53. Thus, the ridge vent system of the invention serves the function of ventilation and also serves an auxiliary function such as the production of electrical power.

Figure 4:
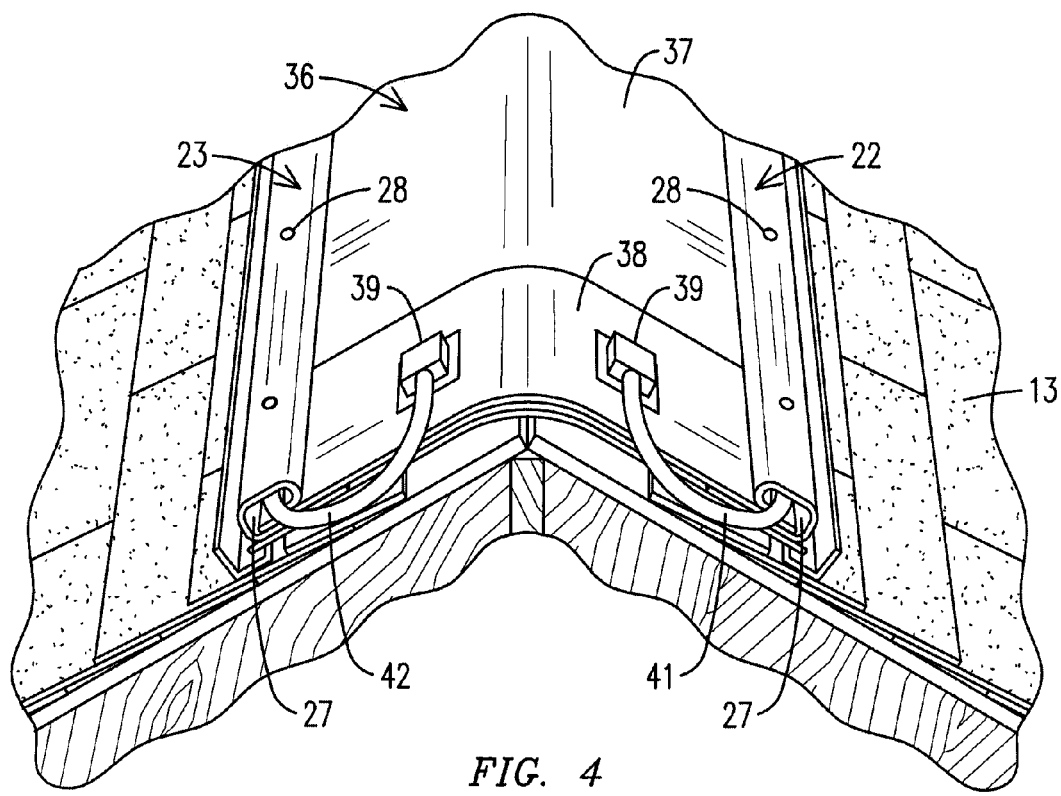
FIG. 4 is a perspective view of a ridge vent according to the invention with solar panel attached on the ridge vent and illustrating management of electrical wires of the solar panel.
Figure 5:
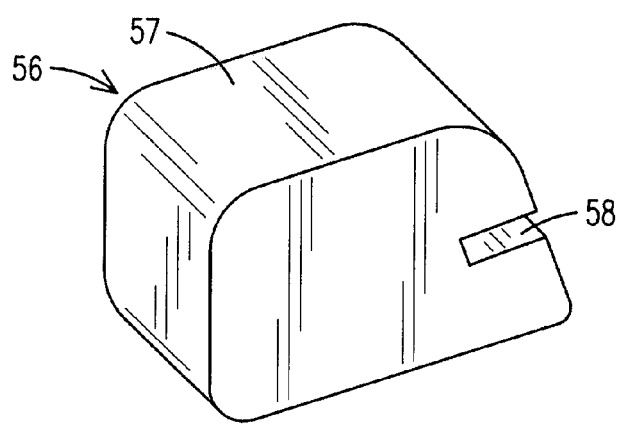
FIG. 5 is a perspective view of an end plug for insertion into open ends of the channel member to seal them.

FIG. 4 depicts an end of a ridge vent system according to the invention with a flexible solar panel 36 mounted on a ridge vent and held in place along its edges by channel members 22 and 23. The flexible solar panel 36 has an active portion 37 that produces electrical power when exposed to sunlight and an inactive endlap portion 38. Junction boxes 39 are disposed on the endlap portion 37 and are connected to the positive and negative electrical outputs of the active portion 37 of the solar panel 36. A positive wire 41 (or vice versa) extends from one of the junction boxes and a negative wire 42 (or vice versa) extends from the other one of the junction boxes. The management of these wires so that they are not seen and are better protected is accomplished by extending the wires through the channels 27 of the channel members as shown. From there, they may be directed to a remote location where they may be electrically connected to an electronics package for exploiting the electrical power they carry. As mentioned, the endlap portions of solar panels that are arranged end-to-end along the ridge vent are covered by the end of the active portion of the next adjacent solar panel. The end of the last solar panel in the array, such as that illustrated in FIG. 4, may be covered by a membrane to protect and hide the junction boxes and wires.

It has been found to be advantageous to plug the open ends of the channels 27 at the end of an installation of a ridge vent. This, it is found, is very efficient in preventing wind from blowing into the channels and dislodging the edges of solar panels or other auxiliary components from the channels. FIG. 4 illustrates a suitable end plug for this purpose. The end plug 56 preferably is made of a semi-rigid foam material and has a profile 57 that matches that of the interior of the channels formed by the channel members. A slot 58 is formed along the end plug 56 for receiving the in-turned end of the hood at the channel slot of the channel. When inserted into open ends of channels, the end plug 57 has proven exceedingly efficient at preventing solar panels or other components from being dislodged by wind from the channels.

Figure 6:
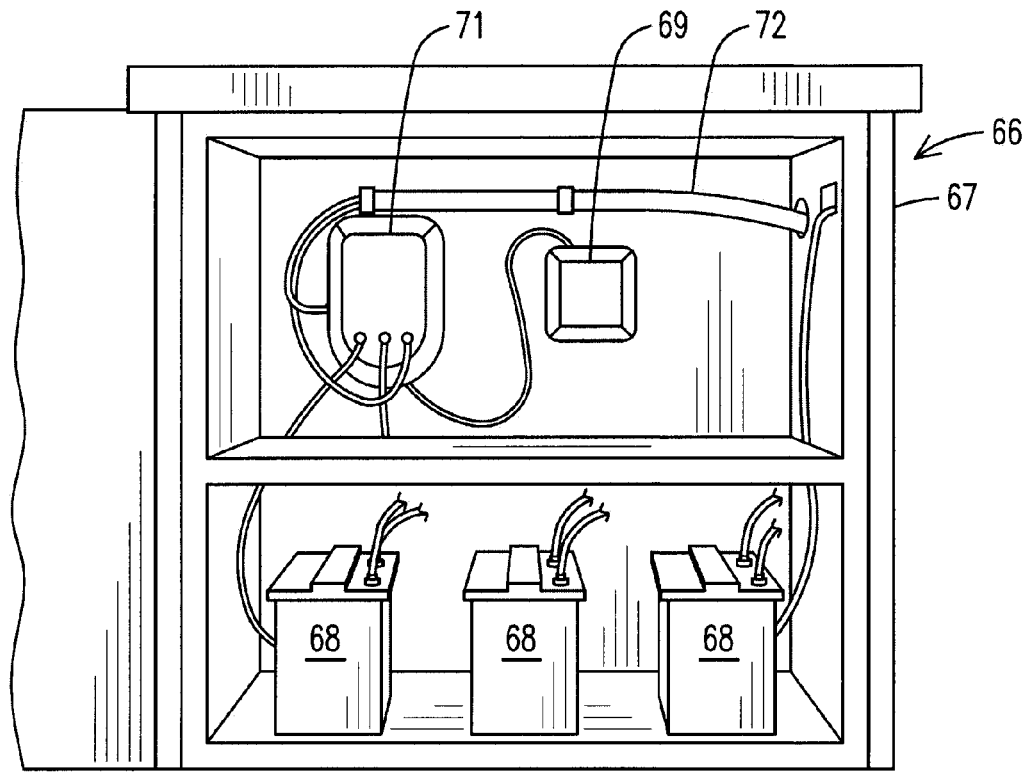
FIG. 6 illustrates one possible embodiment of an electrical box containing electronic components for converting DC power from solar panels to usable electricity.
Figure 7:
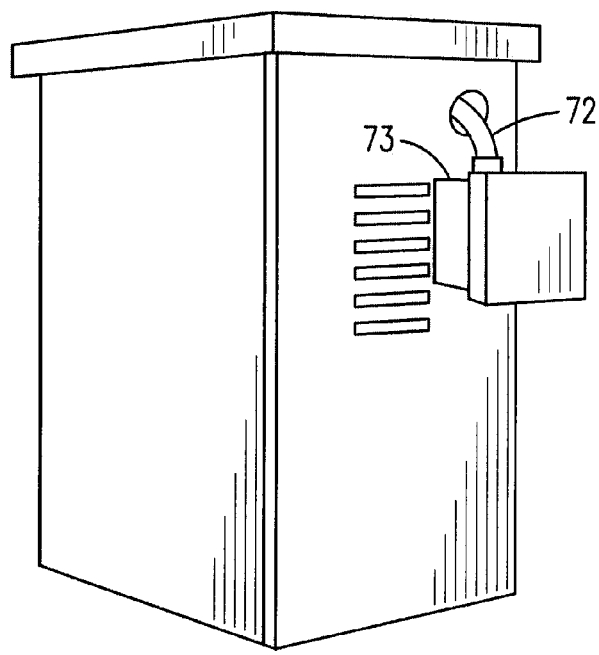
FIG. 7 is a perspective side view of the electrical box of FIG. 6 illustrating the AC outlet of the box.

FIGS. 6 and 7 illustrate one possible embodiment of an electrical box that houses electronic components that transform the DC electrical power of the solar panels to usable AC power that can be accessed by homeowners, particularly in an emergency power outage. The electrical box may be mounted in an attic, garage, outbuilding, or other location and wires from the solar panels of the ridge vent system connect to the electrical box. Referring to FIG. 6, the electrical box 66 includes an enclosure 67 that houses one or more rechargeable batteries 68, a charge controller 69, and a power inverter 71. As detailed below with reference to FIG. 8, the DC output of the solar panels is connected through the charge controller to the DC inputs of the power inverter 71. The charge controller manages the charging of the batteries and insures that they are not overcharged or produce undesirable back-currents as they charge. The power inverter 71 converts the DC electrical power from the solar panels, or the DC electrical power stored in the batteries, to AC electrical power.

An AC cable extending through conduit 72 connects to the AC output of the power inverter 71 and extends out of the enclosure 67, where it terminates at a traditional AC outlet 72. AC power is thus accessible when the solar panels are exposed to sunlight through the AC outlet 72. The system of this invention most preferably is not coupled to the public electrical grid as are traditional home solar power systems. Thus, independent AC power is accessible at the AC outlet 72 regardless of whether the public electrical power grid is up or down. When the solar panels are bathed in sunlight, the AC electrical power derives from the DC power generated by the solar panels. At night, or when overcast, the AC electrical power derives from DC power previously stored in the batteries 68.

The solar panels of the present ridge vent system are insufficiently numerous to produce large amounts of electrical power. Thus, it is not intended that large appliances or other power thirsty equipment be operated with the system disclosed herein. Rather, it is intended to provide a source of emergency electrical power when the public electrical grid is down for extended periods of time. The electrical power can be used to maintain the charge of cell phones, flashlights, and radios and may be used to operate televisions to provide emergency information to homeowners. Alternatively, the system of this invention may be installed on a tool shed and connected to maintain the charge of battery powered tools even when the public electrical grid is down. These and other uses are particularly helpful during large and extended emergencies such as hurricanes and debilitating blizzards.

Figure 8:
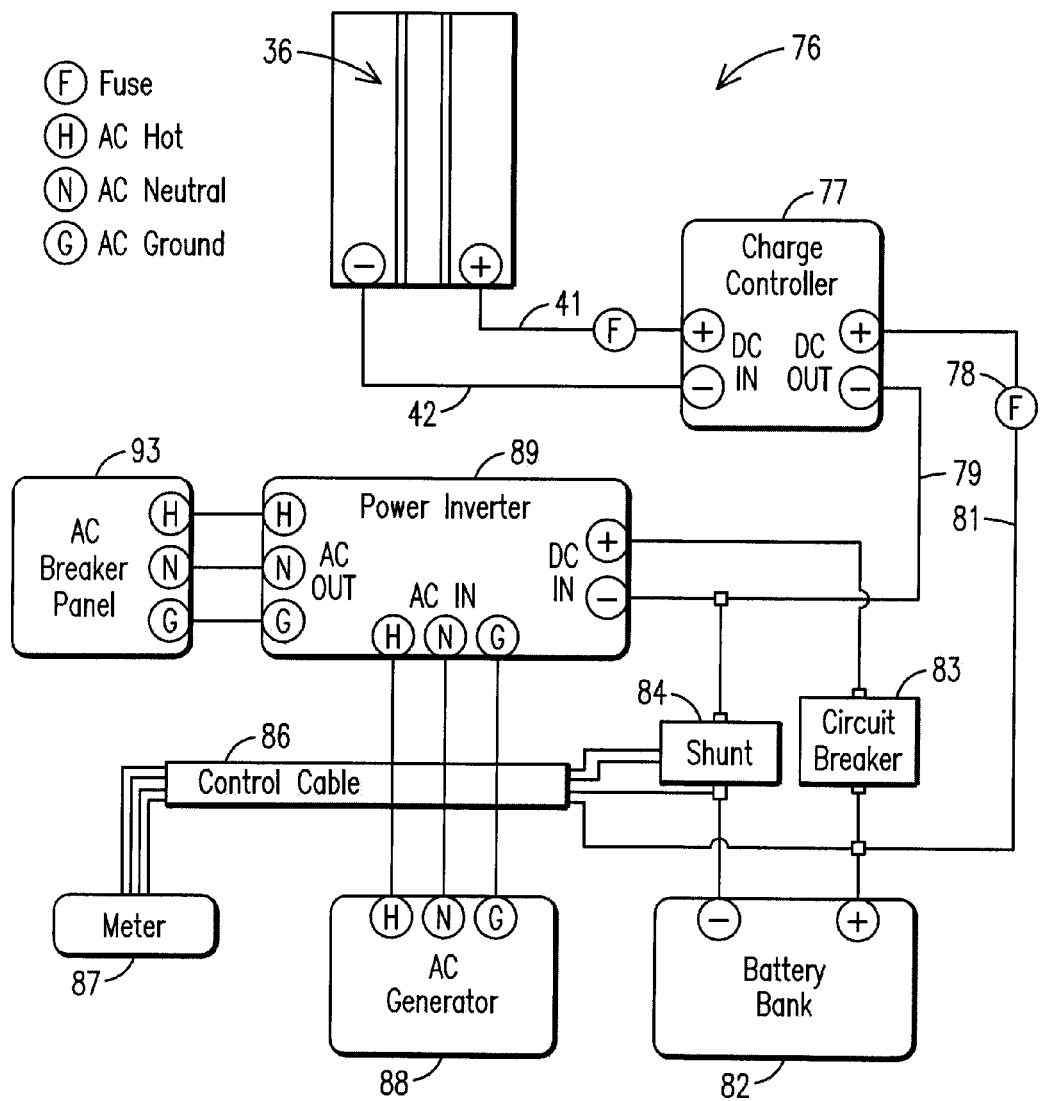
FIG. 8 is an electronic schematic showing one possible circuit for converting power from solar panels to usable electricity.

FIG. 8 is an electrical schematic showing one possible arrangement of electronic components for use in the invention. The solar ridge vent system 36, previously described, is connected through a fuse F to the inputs of a charge controller 77, which controls the charging of one or more batteries of a battery bank 82. The positive output of the charge controller 77 is connected to the positive terminal of the battery bank 82 and, through circuit breaker 83, to the positive DC input of the power inverter 89. The negative output of the charge controller 77 is connected to the negative input of the power inverter 89 and, through shunt 84, to the negative terminal of the battery bank 82. The shunt is controllable by a meter 87, which can, if necessary, discontinue the flow of DC power from the solar panels to the battery bank. Under normal operating conditions, DC electrical power from the solar panels of system 36 and DC power from the battery bank 82 are coupled to the DC input of the power inverter 89.

The power inverter 89 converts the DC input to AC electrical power that can be accessed through hot, neutral, and ground leads on the AC output of the power inverter. These leads, in turn, are connected to an AC circuit breaker panel and then to a user accessible AC outlet 73 (FIG. 7). The AC circuit breaker panel includes circuit breakers to ensure that large demands for AC power exceeding the limits of the system do not destroy components of the system. As mentioned, the system of this invention is not intended to supply large amounts of power for powering larger appliances. An auxiliary AC generator may be connected to the AC inputs of the power inverter if desired to provide AC power at the AC outlet 73 if the solar panels should fail or the battery bank be drained. While one particular arrangement of components and their connections are illustrated as exemplary, it will be understood that a variety of other or different components may be used to accomplish the functions of the invention in equivalent ways.

Figure 9:
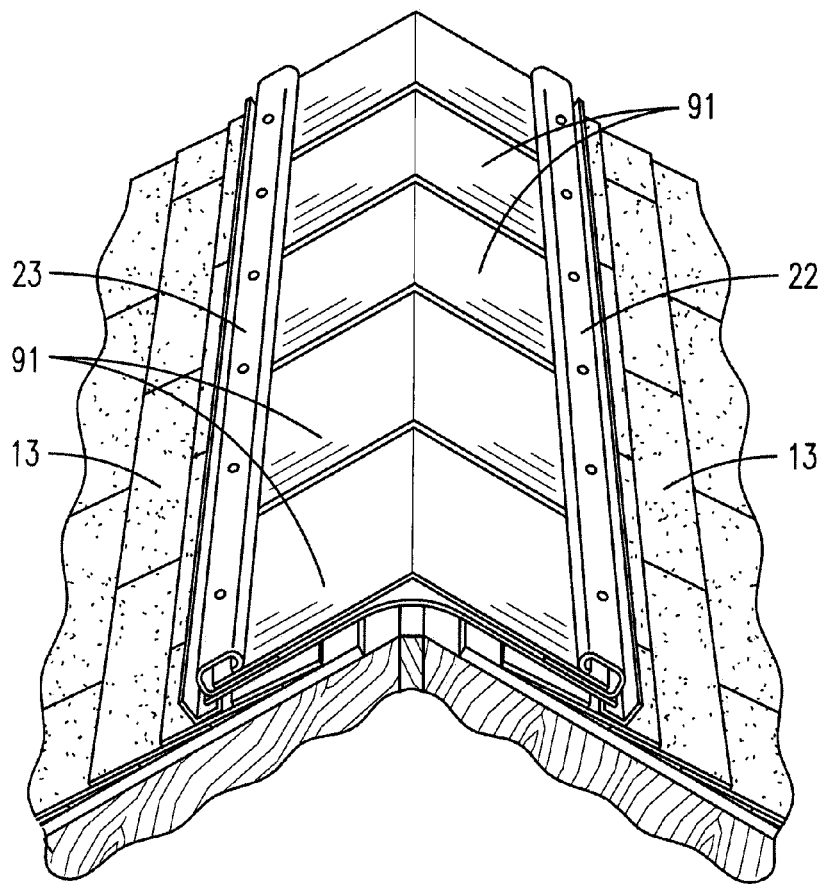
FIG. 9 is a perspective view of the ridge vent of this invention illustrating an alternate use for holding slate cap shingles.
Figure 10:
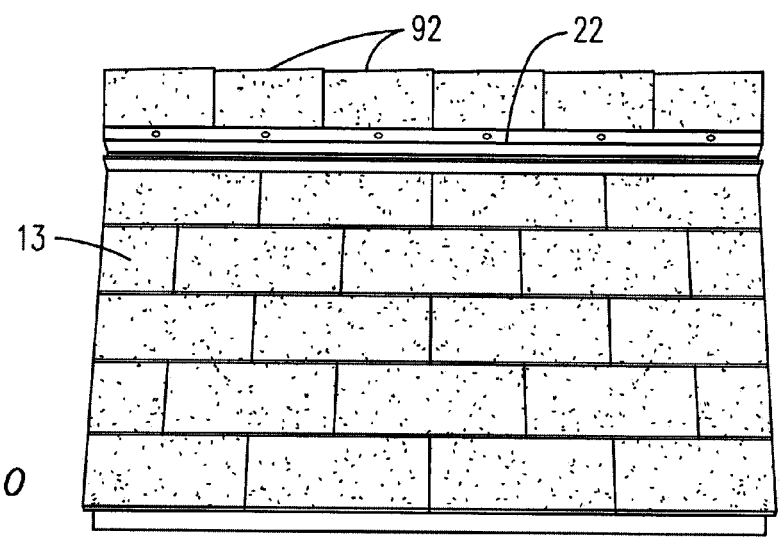
FIG. 10 is a side view of the ridge vent of this invention illustrating another alternate use for holding traditional asphalt ridge cap shingles.

FIGS. 9 and 10 show the ridge vent system of the present invention used for purposes other than electrical power generation. In FIG. 9, slate caps 91 of the type used to cap slate roofs are mounted on the ridge vent and held in place with their edges extending into the channels formed by channel members 22 and 23. No nails or auxiliary fasteners are required. FIG. 10 shows a similar use wherein traditional asphalt ridge cap shingles 92 are mounted on the ridge vent and held in place with their edges extending into the channels of the channel members. Other applications not shown also are possible. For example, an emergency panel containing light emitting elements may be mounted on the ridge vent and connected to a security system to be lighted or flashed when there is a break-in or other emergency. In this way, first responders may better be able to locate a home in distress. The system of the invention also may be used to heat water by mounting on the ridge vent a bat of material through which fluid conduits extend. When the ridge vent is exposed to sunlight, fluid moving through the conduits absorbs the solar heat and the hot fluid may be used in a heat exchanger to heat water or for other purposes.

The invention has been described herein in terms of preferred embodiments and methodologies considered by the inventors to represent the best mode of carrying out the invention. It will be understood by the skilled artisan; however, that a wide range of additions, deletions, and modifications, both subtle and gross, may be made to the illustrated and exemplary embodiments without departing from the spirit and scope of the invention set forth in the claims. For instance, while the invention has been illustrated within the context of a ridge vent, it also may be applied to other roof mounted structures such as, for instance, roof deck mounted structures, soffits, or even structures mounted to a side of a home. In fact, the system may be deployed along the ridge of an existing roof with a ridge-vent-like panel that does not actually function to ventilate an attic below. The materials suggested for the various components are not limiting and may be substituted with others with equivalent results. Finally, while the preferred embodiment includes separate channel members that are fixed to the central panel of a ridge vent, it is contemplated that the ridge vent may itself be molded with the channel members as a unitary feature of the ridge vent. Indeed, while semi-rigid injection molded ridge vents are illustrated in the exemplary embodiments, it is contemplated and within the scope of the invention that other types of ridge vents, such as those made of open weave material, may be formed or provided with channels for attaching components within the scope of the invention. Accordingly, the scope of the invention exemplified in the above description is delimited only by the claims.

What is claimed is:

1. A ridge vent system comprising:
    an elongated laterally flexible panel having a central portion and longitudinally extending first and second edge portions, the central panel having a first surface that faces away from a roof when the ridge vent is installed and a second surface;
    a ventilation grid disposed along the first and second edge portions of the central panel;
    a first channel member on the first surface of the panel extending along the first edge portion thereof, the first channel member defining a first channel with a channel slot facing the central portion of the flexible panel and providing access to the first channel;
    a second channel member on the first surface of the panel extending along the second edge portion thereof, the second channel member defining a channel with a channel slot facing the central portion of the flexible panel and providing access to the second channel;
    the first and second channels being sized to receive edge portions of and hold at least one solar panel attached to the ridge vent; and
    at least one solar panel covering at least a portion of the first surface of the laterally flexible panel, the solar panel having spaced apart edge portions each extending through the channel slot of and being disposed in a respective one of the first and second channels to hold the at least one solar panel on the ridge vent.

2. The ridge vent system of claim 1 wherein the at least one solar panels has output wires and wherein the first and second channels are further sized to contain the output wires of solar panels held by the channels.

3. The ridge vent system of claim 1 further comprising a an electrical box located remotely from the ridge vent and containing a power inverter and a power outlet, the at least one solar panel being electrically connected to power inverter in the electrical box to provide usable power at the power outlet.

4. The ridge vent system of claim 3 further comprising at least one battery in the electrical box, the at least one solar panel being coupled to charge the at least one battery to provide usable power when the at least one solar panel is not able to provide usable power.

5. The ridge vent system of claim 1 further comprising an emergency location panel covering at least a portion of the first surface of the ridge vent and having spaced apart edges captured within the first and second channels to hold the emergency location panel on the ridge vent, the emergency location panel comprising light emitting elements that can be activated in an emergency to identify to authorities a home experiencing an emergency.

* * * * *